United States Patent [19]
Hilpert

[11] Patent Number: 5,859,772
[45] Date of Patent: Jan. 12, 1999

[54] PARALLEL CONNECTION OF CONTROLLABLE SEMICONDUCTOR COMPONENTS

[75] Inventor: Gerald Hilpert, Lauchringen, Germany

[73] Assignee: ABB Daimler-Benz Transportation (Technology) GmbH, Berlin, Germany

[21] Appl. No.: 910,076

[22] Filed: Aug. 12, 1997

[30] Foreign Application Priority Data

Sep. 25, 1996 [DE] Germany ................. 196 39 279.9

[51] Int. Cl.⁶ .................................................. H02M 7/5387
[52] U.S. Cl. ........................ 363/132; 361/94; 327/405; 363/56
[58] Field of Search ................................ 327/405, 492; 323/272; 363/132, 98, 56; 361/18, 84, 94

[56] References Cited

U.S. PATENT DOCUMENTS

| | | |
|---|---|---|
| 3,699,358 | 10/1972 | Wilkinson . |
| 4,201,957 | 5/1980 | Cathell ........................................ 363/17 |
| 4,583,146 | 4/1986 | Howell ........................................ 361/13 |

FOREIGN PATENT DOCUMENTS

| | | |
|---|---|---|
| 2831495 | 1/1980 | Germany . |
| 3420535A1 | 12/1985 | Germany . |
| 3837458A1 | 5/1990 | Germany . |
| 4330381A1 | 3/1995 | Germany . |

*Primary Examiner*—Shawn Riley
*Attorney, Agent, or Firm*—Burns, Doane, Swecker & Mathis, L.L.P.

[57] ABSTRACT

Converters having a 1st power converter (1) on the mains systems side and a 2nd power converter (9) on the load side may have valve arms with insulated gate bipolar transistors (IGBTs) (T1, T2; T1', T2'). In order to be able to switch high currents, as are required in traction applications, a plurality of IGBTs (T1, T2) and (T1', T2') are operated electrically in parallel with one another. In order to avoid destruction or explosion of a module having IGBTs (T1, T2; T1', T2') of this type in the event of a short circuit, a fuse (Si1, Si2; Si1', Si2') is connected in series with each IGBT (T1, T2; T1', T2') on the cathode side thereof, which fuse blows when a predeterminable limit current intensity is exceeded, and thereby interrupts the short-circuit current. The current then flows only via the parallel-connected IGBT. The fuses (Si1, Si2; Si1', Si2') used are bonding wires whose cross section and number are dimensioned such that they interrupt a short-circuit current when the predeterminable limit current intensity is exceeded. In this case, the anode-side terminals of the IGBTs (T1, T2; T1', T2') must not melt, that is to say they must have a smaller electrical resistance than the cathode-side terminals. In the absence of a short-circuit current limiter (3), in power converters (1, 9) having a DC voltage intermediate circuit (2), very high short-circuit currents occur in the DC voltage intermediate circuit (2) and in the phase modules of the relevant power converter (1, 9) in the event of the short circuit of an intermediate circuit capacitor (C1, C2, C3), as a result of the low-impedance discharge of the latter. In order to limit the short-circuit current intensity to safe values, a reversible short-circuit current limiter (3, 8) is connected in series with at least one intermediate circuit capacitor (C2) or with a capacitor bank (C3) of the DC voltage intermediate circuit (2).

4 Claims, 3 Drawing Sheets

5,859,772

PARALLEL CONNECTION OF CONTROLLABLE SEMICONDUCTOR COMPONENTS

BACKGROUND OF THE INVENTION

1. Field of the Invention

The present invention relates to a power converter circuit having at least two controllable semiconductor components connected in parallel in the anode and cathode sides and having at least one control signal terminal.

2. Discussion of the Background

A semiconductor module as disclosed in DE 3 420 535 A1 operates as a chopper and has a plurality of field-effect transistors, in particular MOS-FETs, which are connected in parallel with one another, for a switching frequency of 20 kHz with switching times of about 100 ns for currents of 120 A, in which module a diode is electrically connected in parallel, via a backup capacitor, with each field-effect transistor, in the immediate vicinity thereof. The close routing in parallel results in a total inductance of only approximately 20 nH. At the same time, switching off 100 A in 100 ns results in an overvoltage of just 20 V.

What is disadvantageous in that case is that very high capacitor discharge currents are established given a defective field-effect transistor in the event of a short circuit, which currents may lead, via an arc, to destruction of the component and to explosion of the module.

DE 4 330 381 A1 discloses a protective circuit for an electrical circuit with a capacitor circuit, in which, in the case of a converter with a DC voltage intermediate circuit, in the event of the short circuit of an intermediate circuit capacitor, a reversible short-circuit current limiter prevents impermissibly high short-circuit currents in the DC voltage intermediate circuit and in the phase modules of the relevant power converter. This short-circuit current limiter has a PTC thermistor, which is connected in series, in a low-inductance and cooled manner, with at least one capacitor or with a capacitor bank of the DC voltage intermediate circuit. The PTC thermistor can be arranged in the DC voltage intermediate circuit or in the power converter. In parallel with the PTC thermistor, it is possible to connect a varistor and/or a non-reactive resistor and/or a diode reverse-biased in the direction of a short-circuit path, it being possible to combine the PTC thermistor and varistor or PTC thermistor and non-reactive resistor to form one component.

U.S. Pat. No. 4,583,146 discloses connecting a PTC thermistor and a varistor in parallel with a mechanical interrupter contact.

DE-A 2 831 495 discloses an overcurrent protection arrangement for an intermediate circuit converter or self-commutated invertor, in which a transistor is connected in series with the intermediate circuit capacitor, which transistor is in the on state during normal operation and is turned off in the event of a disturbance. A diode is reverse-connected in parallel with this transistor.

The production of a fuse by bonding is disclosed in DE 38 37 458 A1.

SUMMARY OF THE INVENTION

Accordingly, one object of the invention is to provide a novel power converter circuit of the type mentioned in the introduction which is developed further in such a way that overcurrents occurring on account of disturbances are immediately distributed between intact controllable semiconductor components.

One advantage of the invention is that the module with the gate turn-off semiconductor components does not explode. The energy released in the event of a fault is distributed throughout the entire module, with the result that the semiconductor components which are not defective do not melt.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
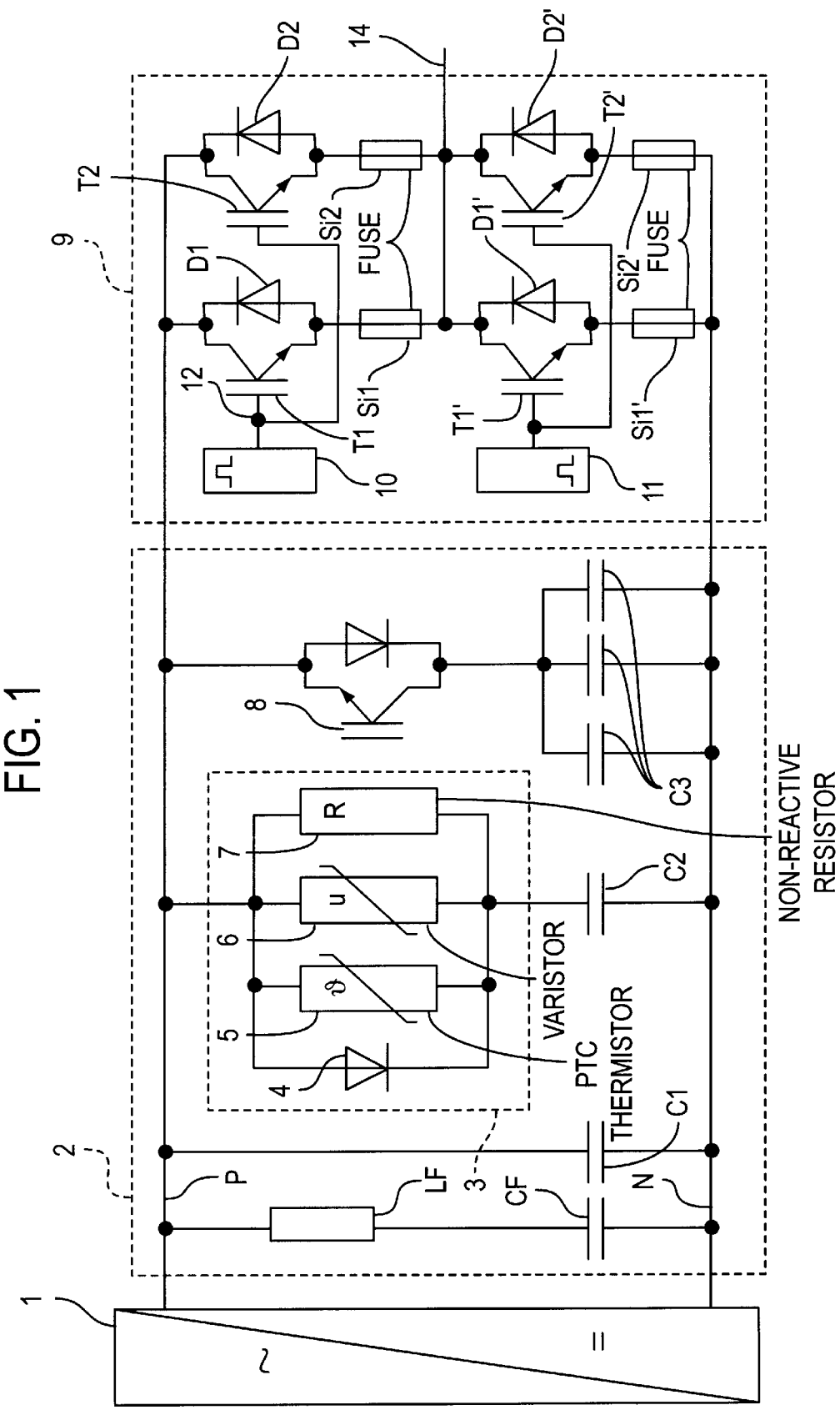
FIG. 1 shows a 2-point power converter circuit having a driving power converter which is connected via a DC voltage intermediate circuit to a mains-system power converter.

Referring now to the drawings, wherein like reference numerals designate identical or corresponding parts throughout the several views, FIG. 1 shows a mains-system power converter or 1st power converter (1), which is electrically connected on the DC voltage side, via a DC voltage intermediate circuit (2), to a driving power converter or 2nd power converter (9).

Between a positive pole or a positive busbar (P), and a negative pole or a negative busbar (N), the DC voltage intermediate circuit (2) has a DC voltage of, for example, 3.4 kV and an electrical filter for attenuating intermediate circuit harmonics, which filter comprises a series circuit formed by a filter inductor (LF) and a filter capacitor (CF); furthermore intermediate circuit capacitors or capacitors (C1, C2), the capacitor (C2) being connected in series with a reversible short-circuit current limiter (3). The reversible short-circuit current limiter (3) has a parallel circuit formed by a diode (4), which is reverse-biased in the direction of a short-circuit path, a PTC thermistor (5), an overvoltage arrester or varistor (6) and a non-reactive resistor (7). The PTC thermistor (5) is always present in the short-circuit current limiter (3); the varistor (6), non-reactive resistor (7) and diode (4) may be connected in parallel with the PTC thermistor (5) individually or in combination.

A PTC thermistor (5) manifests so-called PTC behavior (PTC=positive temperature coefficient). The PTC thermistor (5) and varistor (6) are preferably combined to form one resistance body. What is also particularly suitable is a resistance body which combines a PTC thermistor (5) with a non-reactive resistor (7) in one component.

An intermediate circuit capacitor bank (C3) is connected in series with an insulated gate bipolar transistor (IGBT) (8), which is normally on and is switched off in the event of a fault. A diode for charging the intermediate circuit capacitor bank (C3) is reverse-connected in parallel with the insulated gate bipolar transistor (8). It goes without saying that instead of an intermediate circuit capacitor bank (C3), a plurality of individual capacitors can also each be connected in series with such an insulated gate bipolar transistor (8).

The two power converters (1, 9) are designed as 2-point power converters, only 4 main valve arms with 4 insulated gate bipolar transistors (T1, T2; T1', T2') as main valves for an AC phase, which can be picked off at an AC voltage terminal (14), being shown for the power converter (9) in FIG. 1. 3-Phase alternating current correspondingly necessitates 3·4 identically constructed main valve arms. A freewheeling diode (D1, D2; D1', D2') is electrically reverse-connected in parallel with each insulated gate bipolar transistor (T1, T2; T1', T2'). Provided in series with each of these parallel circuits formed by insulated gate bipolar transistor (T1, T2; T1', T2') and freewheeling diode (D1, D2; D1', D2') is, on the cathode side with regard to the insulated gate bipolar transistor, a respective short-circuit current limiter or a fuse (Si1, Si2; Si1', Si2'), which blows when a predeterminable limit current intensity ($i_G$) is exceeded. This fuse (Si1, Si2; Si1', Si2') preferably comprises bonding wires made of aluminum whose diameter and number are dimensioned such that they melt when the predeterminable limit current intensity ($i_G$) is exceeded, and consequently interrupt a current through the associated insulated gate bipolar resistor (T1, T2; T1 ', T2') or the freewheeling diode (D1, D2; D1', D2'). Between the positive busbar (P) and the AC voltage terminal (14), at least two insulated gate bipolar transistors (T1, T2) with associated freewheeling diodes (D1, D2) are electrically connected in parallel via their fuse (Si1, Si2). Likewise, between the negative busbar (N) and the AC voltage terminal (14), at least two insulated gate bipolar transistors (T1', T2') with associated freewheeling diodes (D1', D2') are electrically connected in parallel via their fuse (Si1', Si2'). The insulated gate bipolar transistors (T1, T2) are jointly controlled by means of a switching signal generator (10) and the insulated gate bipolar transistors (T1', T2') are jointly controlled by means of a switching signal generator (11).

Figure 2:
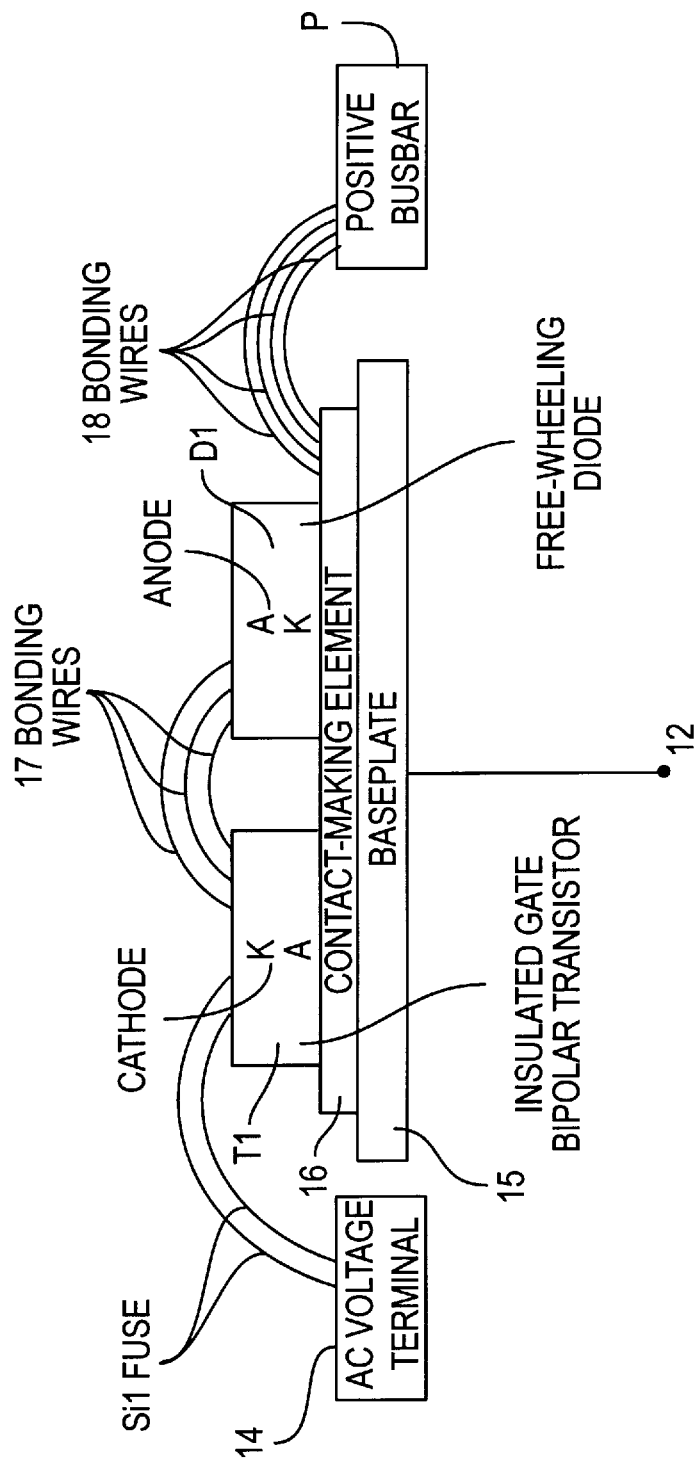
FIG. 2 shows a fundamental structure of an insulated gate bipolar transistor with freewheeling diode of the driving power converter according to FIG. 1.

FIG. 2 shows the fundamental structure for the insulated gate bipolar transistor (T1) with reverse-connected parallel freewheeling diode (D1), which are both electrically connected to the positive busbar (P) by means of an electrically well-conducting contact-making element (16), preferably made of copper, via bonding wires (18), preferably made of ultra-pure aluminum. The contact-making element (16) is connected in a well-conducting manner to a baseplate (15), preferably made of aluminum nitride, which simultaneously serves as a heat sink. The insulated gate bipolar transistor (T1) is electrically connected on its cathode side to the anode side of the freewheeling diode (D1) via bonding wires (17) and to the AC voltage terminal (14) via the fuse (Si1). The anode side of the insulated gate bipolar transistor (T1) and the cathode side of the diode (D1) are electrically connected to the positive busbar (P) via the contact-making element (16) and the bonding wires (18). The control signal terminal (12) is not illustrated in FIG. 2.

It is important that the anode-side current terminal of the insulated gate bipolar transistor (T1) has a smaller, preferably at least 10% smaller, electrical resistance than the cathode-side terminal of said transistor. This is indicated in FIG. 2 by the fact that the number of bonding wires (Si1) is less than the number of bonding wires (17) and (18). In terms of their cross section and number, the bonding wires must be dimensioned such that the bonding wires (Si1) reliably melt in the event of a short circuit, whereas the bonding wires (17) and (18) must not melt.

Figure 3:
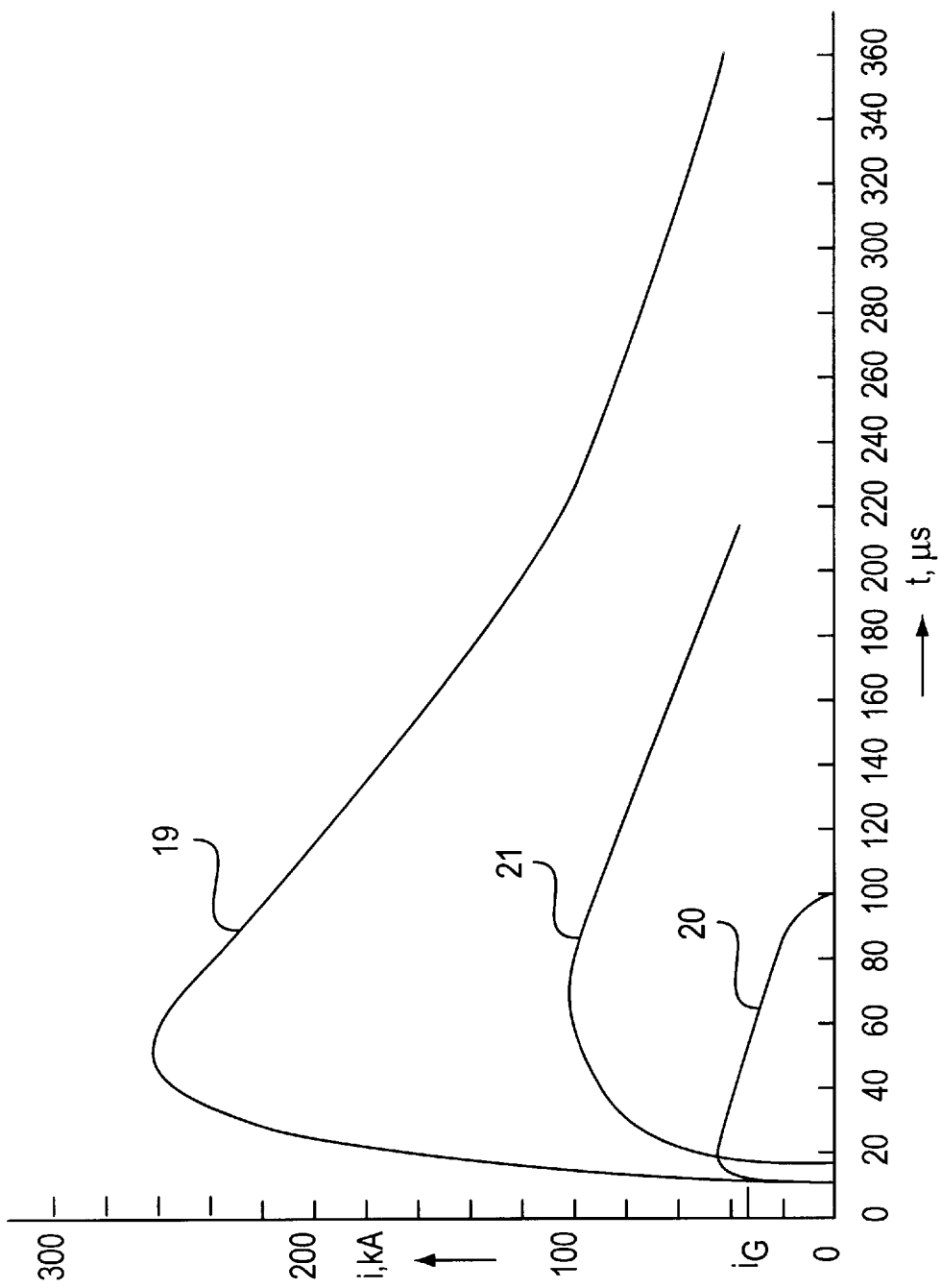
FIG. 3 shows a signal diagram for explaining the effect of the measure according to the invention.

In FIG. 3, the current intensity (i) in kA is plotted on the ordinate and the time (t) in $\mu$s is plotted on the abscissa. A curve (19) shows the time characteristic of a short-circuit current between the positive busbar (P) and the negative busbar (N) via defectively simultaneously switched-on insulated gate bipolar transistors (T1, T2; T1', T2'), without a capacitor (C1) and without fuses (Si1, Si2; Si1', Si2'). The intermediate circuit capacitors (C2) and (C3) are discharged via these insulated gate bipolar transistors (T1, T2; T1', T2') and, within 40 As, bring about a current increase to about 260 kA, which leads to arc formation and explosion of the module with the insulated gate bipolar transistors (T1, T2; T1', T2').

A curve (20) shows the time characteristic of the current through a defective insulated gate bipolar transistor, for example (T1), when the fuses (Si1, Si2; Si1', Si2') are present. If the current intensity (i) through the insulated gate bipolar transistor (T1) or through the diode (D1) exceeds the limit current intensity ($i_G$), then the fuse (Si1) melts, and possibly the insulated gate bipolar transistor (T1) as well. The current through these two components disappears within about 100 $\mu$s. The melting of the fuse (Si1) and possibly of the insulated gate bipolar transistor (T1) means that the control signal terminal (12) of said transistor receives the voltage potential of the positive busbar (P), with the result that the parallel-connected insulated gate bipolar transistor (T2) is switched on since its control signal terminal is conductively connected to the control signal terminal (12) of the insulated gate bipolar transistor (T1). This insulated gate bipolar transistor (T2) and any further parallel-connected insulated gate bipolar transistors (not illustrated) now jointly accept the short-circuit current in accordance with a curve (21) until a point in time when the energy of the intermediate circuit capacitors (C1–C3) has been consumed (approximately after 5 ms–10 ms) or until a superordinate protection device (not illustrated) has detected the fault and interrupts the supply of current. The current intensity (i) through the individual parallel-connected insulated gate bipolar transistors (T2) is in each case below the limit current intensity ($i_G$) of the fuse (Si2) thereof. Only the aggregate current intensity can be greater. This measure prevents the situation where even further insulated gate bipolar transistors melt and are thus destroyed in addition to the defective insulated gate bipolar transistor (T1) and/or the defective freewheeling diode (D1). The number of parallel-connected insulated gate bipolar transistors must be selected such that in the event of a fault, they can accept the short-circuit current without being destroyed.

The loading on the insulated gate bipolar transistors (T1, T2; T1', T2') in the event of a short circuit is dependent on the electrical energy E of the intermediate circuit capacitors (C1–C3) in accordance with E=0.5 (C1+C2+C3)·U$^2$. At an intermediate circuit voltage U of 3.4 kV and C1+C2+C3=6 mF, E=34.7 kJ. As a result of the short circuit, this energy is converted into:

Joule heat in the resistance of the short-circuit path (desirable), deformation work (not desirable) and arc heat and arc radiation (not desirable).

An arc is produced when the electrically conductive connection opens due to the deformation work and/or the Joule heat. The thermally induced tearing of the bonding wires (Si1, Si2; Si1', Si2') is accelerated by magnetic forces produced by current.

After the bonding wires (Si1, Si2; Si1', Si2') have melted, a voltage of the intermediate circuit capacitors (C1–C3) of about 3 kV is still present across the contact points of the bonding wires. The current chopping after the melting additionally leads to a turn-off overvoltage. The remaining pieces of the bonding wires cause a severe excessive field increase.

Series-connected insulated gate bipolar transistors (T1, T2; T1'; T2') must never simultaneously be in the on state during normal operation.

It is advantageous if a reversible short-circuit current limiter (3) is provided in the short-circuit current path of at least one intermediate circuit capacitor (C2). As a result, any short-circuit discharge currents of the capacitor (C2) are limited to values which are at least below the destruction limit of the passive components and of the busbars, ideally below the destruction limit of the active components. The reaction times of the protective circuit which are required for this are in the region of 100 $\mu$s.

The protective circuits according to FIG. 1 ensure good protection both in the event of a partial short circuit and in the event of a complete short circuit of a power converter (1, 9).

The fact that a diode (4) is connected in parallel with a PTC thermistor (5) enables the thermal loading, caused by continuous current, on the reversible short-circuit current limiter (3) to be reduced. During operation under rated conditions, the diode (4) is in the on state during a half-period of the intermediate circuit pulse frequency and thus reduces the route-mean-square current. In the event of a short circuit, the diode (4) is in the off state and the protection function of the reversible short-circuit current limiter (3) is fully active.

If one or more intermediate circuit capacitors (C1) are left without a reversible short-circuit current limiter (3), while the remaining intermediate circuit capacitors (C2) have one, then protection against turn-off overvoltages is achieved. However, the short-circuit current amplitude of the total current in the DC voltage intermediate circuit is increased proportionally.

It goes without saying that the 1st power converter (1) can also have insulated gate bipolar transistors (T1, T2; T1', T2') wired up to fuses (Si1, Si2; Si1', Si2') according to the invention and having associated freewheeling diodes (D1, D2; D1', D2').

Instead of insulated gate bipolar transistors (T1, T2; T1', T2'), it is also possible to employ other gate turn-off semiconductor components, in particular field-effect transistors.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A power converter circuit
   a) having at least two controllable semiconductor components (T1, T2; T1', T2');
   b) which are connected in parallel on the anode and cathode sides and
   c) have at least one control signal terminal (12), wherein
   d) the cathode-side terminal of each of the parallel-connected controllable semiconductor components (T1, T2; T1', T2') has a short-circuit current limiter (Si1, Si2; Si1', Si2'),
   e) the anode-side terminal of each of the parallel-connected controllable semiconductor components (T1, T2; T1', T2') is dimensioned in such a way that it does not open when one of said short-circuit current limiters (Si1, Si2; Si1', Si2') opens, and
   f) at least one control signal terminal (12) of each controllable semiconductor component (T1, T2; T1', T2') is electrically connected to a control signal terminal (12) of at least one further parallel-connected controllable semiconductor component (T1, T2; T1', T2').

2. The power converter circuit as claimed in claim 1, wherein
   a) each short-circuit current limiter (Si1, Si2; Si1', Si2') comprises bonding wires, and
   b) an electrical resistance of the anode-side terminal of each controllable semiconductor component (T1, T2; T1', T2') is at least 10% less than an electrical resistance of the cathode-side terminal of said controllable semiconductor component.

3. The power converter circuit as claimed in claim 1 wherein each of the controllable semiconductor components (T1, T2; T1', T2') is an insulated gate bipolar transistor.

4. The power converter circuit as claimed in claim 1 wherein
   a) a freewheeling diode (D1, D2; D1', D2') is reverse-connected in parallel with each controllable semiconductor component (T1, T2; T1', T2'), and
   b) each short-circuit current limiter (Si1, Si2; Si1', Si2') is connected to an electrical junction point between said repective controllable semiconductor component (T1, T2; T1', T2') and said corresponding freewheeling diode.

* * * * *